United States Patent [19]

Arney et al.

[11] Patent Number: 5,397,904
[45] Date of Patent: Mar. 14, 1995

[54] TRANSISTOR MICROSTRUCTURE

[75] Inventors: Susanne C. Arney; Noel C. MacDonald; Jun J. Yao, all of Ithaca

[73] Assignee: Cornell Research Foundation, Inc., Ithaca, N.Y.

[21] Appl. No.: 906,873

[22] Filed: Jul. 2, 1992

[51] Int. Cl.⁶ .......................................... H01L 29/06
[52] U.S. Cl. ...................................... 257/66; 257/417
[58] Field of Search ................................ 257/66, 417

[56] References Cited

U.S. PATENT DOCUMENTS

| | | |
|---|---|---|
| 4,437,226 | 3/1984 | Soclof. |
| 4,648,173 | 3/1987 | Malaviya. |
| 4,685,198 | 8/1987 | Kawakita et al.. |
| 4,706,374 | 11/1987 | Murakami. |
| 4,764,799 | 10/1988 | Malaviya. |
| 4,772,928 | 9/1988 | Dietrich et al.. |
| 4,845,048 | 7/1989 | Tamaki et al.. |
| 4,853,348 | 8/1989 | Tsubouchi et al.. |
| 4,980,317 | 12/1990 | Koblinger et al.. |
| 4,983,535 | 1/1991 | Blanchard. |
| 5,057,450 | 10/1991 | Bronner et al.. |
| 5,072,288 | 12/1991 | MacDonald et al.. |
| 5,126,812 | 6/1992 | Grieff .................... 257/417 |

OTHER PUBLICATIONS

"Nanostructures in Motion" J. J. Yao, MacDonald & Arney Invited Paper: International Symposium on Nanostructures and Mesoscopic Systems, Nanomes '91, Santa Fe, N.M., May 20–24, 1991 pp. 1–9.

"An RIE Process for Submicron, Silicon Electromechanical Structures" Z. Lisa Zhang & MacDonald 1991 IEEE pp. 520–523.

"A Fully Depleted Lean-Channel Transistor (DEL-TA)–A Novel Vertical Ultrathin SOI MOSFET", D. Hisamoto et al, 1990 IEEE pp. 36–38.

"Formation of submicron silicon-on-insulator structures by lateral oxidation of substrate–silicon islands", S. Arney & MacDonald J. Vac. Sci. Technol. B 6(1), Jan./Feb. 1988 pp. 341–345.

"Anisotropic Reactive Ion Etching of $MoSi_2$ and In Situ Doped n+ and p+ Polysilicon Using $Cl_2$ and $BCl_3$" T. C. Mele et al J. Electrochem. Soc.: Solid-State Sci. & Techn. Sep. 1988 pp. 2373–2378.

Primary Examiner—Jerome Jackson
Assistant Examiner—Stephen D. Meier
Attorney, Agent, or Firm—Jones, Tullar & Cooper

[57] ABSTRACT

A method for isolating transistors and a microstructure for providing isolation for transistors includes a beam located on a substrate. The beam is formed from the same material as the substrate, preferably single crystal silicon, and is released so as to be suspended in the cavity and spaced apart from the substrate. The beam is supported in the cavity by a cantilever structure or by spaced pedestals, or both. One or more transistors are fabricated in the beam, and are thus isolated from the substrate and may be isolated from each other if desired. Contact beams may also be provided to contact the transistor electrodes for interconnection of adjacent transistors or connection of the transistors to electrical circuitry on the substrate. The contact beams also provide mechanical support for the beams.

Multiple beams in side-by-side arrays or stacked arrays may be provided.

46 Claims, 8 Drawing Sheets

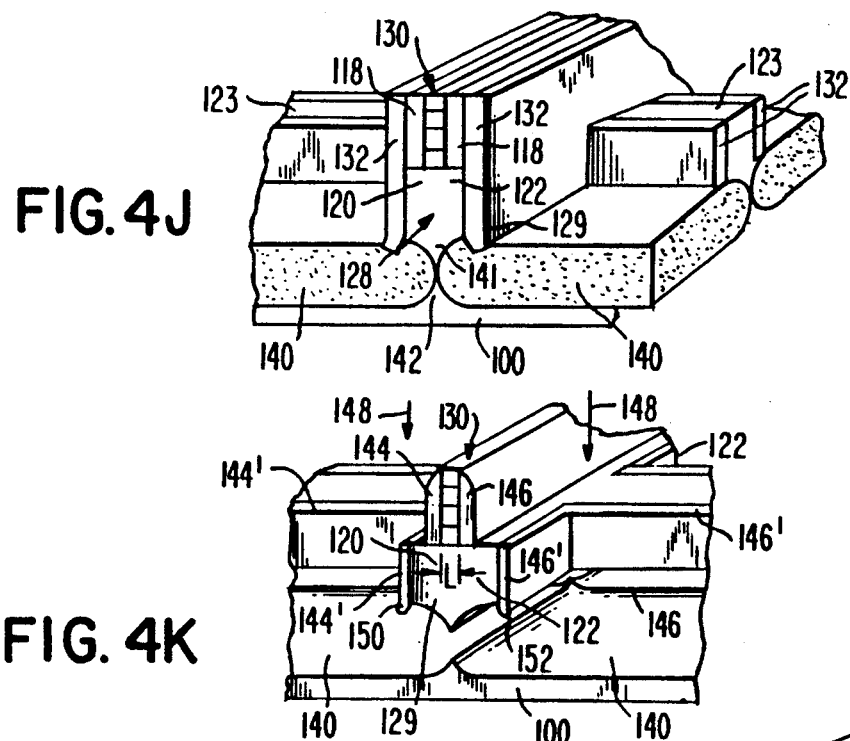
FIG. 4J
FIG. 4K
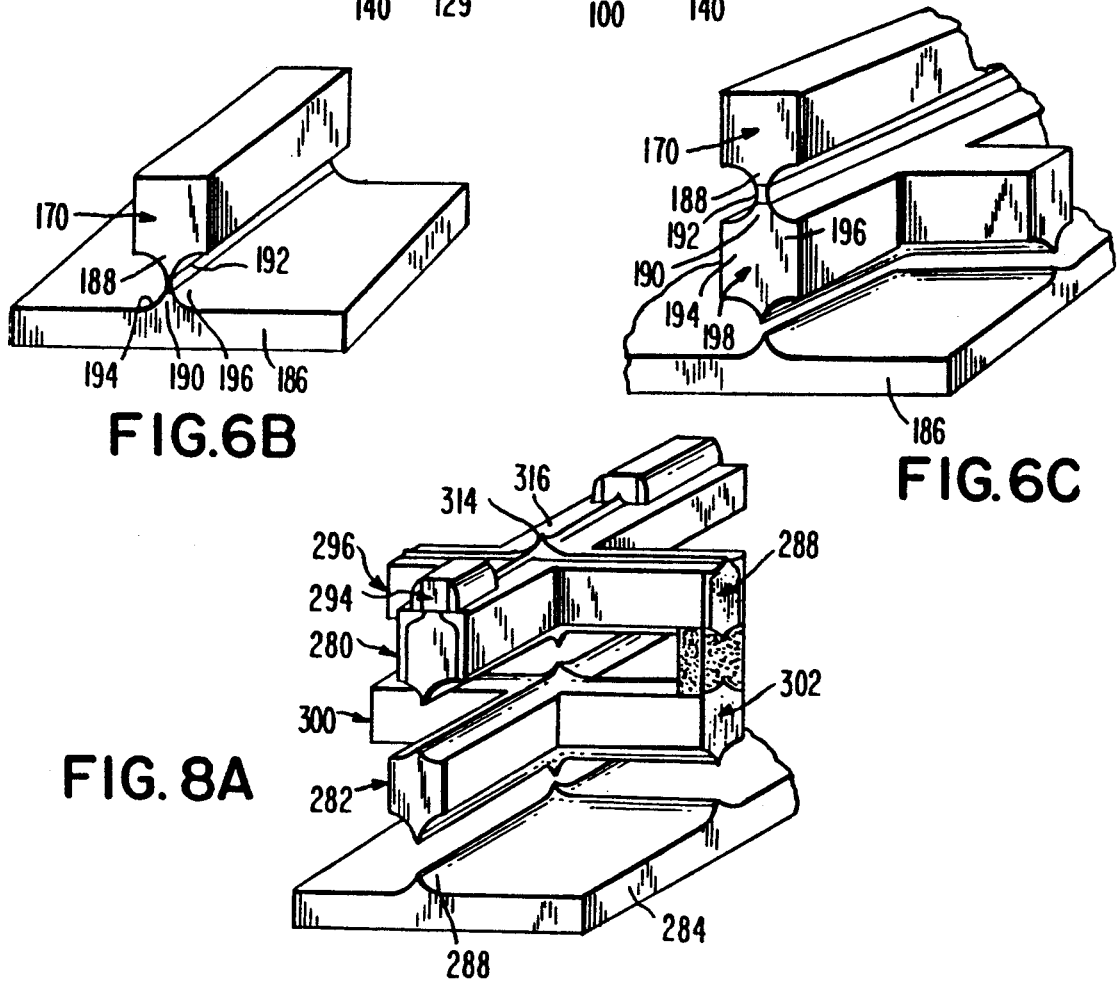
FIG. 6B
FIG. 6C
FIG. 8A

TRANSISTOR MICROSTRUCTURE

BACKGROUND OF THE INVENTION

The present invention relates, in general, to ultra-large scale integration of electronic devices, and more particularly to single crystal beam microstructures formed on a substrate and which incorporate transistor devices. Plural beams may be provided which are electrically isolated from each other both horizontally and in vertical stacks, and isolated from the adjacent substrate so as to permit minimum spacing between adjacent transistor devices. The beams may be movable or stationary and thus the invention further relates to transistor devices mounted in microstructure beams incorporating movable tips for the amplification of currents in such tips.

The trend towards ultra-large scale integration (ULSI) of electronic devices requires ultra-small transistors and isolation structures. However, present device isolation technology places a serious limit on the minimum spacing between electronic devices such as transistors, for either p-n junction space charge region isolation or dielectric isolation increases the area of the substrate which must be devoted to an isolated transistor. This spacing requirement is further increased by the need to have large area planar contacts to the transistors. Many schemes have been suggested to increase the density of electronic devices; for example, it has been suggested that the transistor spacing in ULSI can be reduced by making MESA transistors with sidewall contacts or sidewall silicon gate structures. However, these MESA structures are still connected to the substrate, so electrical isolation is still necessary. The steps required for isolation of these non-planar structures reduces the ultimate circuit density and usually increases the complexity of the fabrication process. Thus, there is a need for an improved technique and structure for isolating transistors in integrated circuits.

For over thirty years, designers of integrated circuits have attempted to form silicon on insulator (SOI) device structures which would simplify transistor-to-transistor isolation spacing, would reduce parasitic capacitance and would thereby offer higher density integrated circuits with improved performance, as by providing faster transistors. The main disadvantages of SOI technology include inferior single crystal silicon material, very high substrate cost, and poor silicon-insulator interface characteristics, and accordingly such devices have not been completely satisfactory and have not provided the sought-after solution for isolating transistors.

Recent developments in microstructure technology for use with integrated circuits have led to the development of nanometer scale tips and opposed tips which are mounted on relatively movable microstructure beams, the tips being connected through the beams to integrated circuits in surrounding substrates. Such tips may be used to sense tunneling currents, for example, with the beams or with conductive layers on the beams transferring the sensed currents to external circuitry in the surrounding substrate. However, such currents are extremely small and the ability to transmit these currents to the surrounding substrate is a limiting factor in the utilization of microstructure tip technology.

SUMMARY OF THE INVENTION

It is an object of the present invention to provide a method and a structure which overcomes the problems of device isolation encountered in USLI technology. It is another object of the present invention to provide a microstructure for detecting extremely small currents and to a transistor microstructure for amplifying such currents.

Another object of the invention is to provide an isolated transistor microstructure for reducing parasitic capacitance and improving the available device density in transistor arrays.

A further object of the invention is to provide an improved method of forming isolated, released microstructure transistors having reduced current leakage and parasitic capacitance.

In accordance with the present invention, the problem of transferring extremely small currents sensed in a nanometer-scale tip assembly of the type used in integrated circuit microstructures is overcome by the incorporation of transistor devices in suspended, single crystal substrate-silicon (SCSS) beams, wherein the beams are fabricated from a single crystal silicon substrate and are wholly or partially released from the substrate, to thereby provide dielectric isolation of the transistor devices. The isolation provided by the beam structure reduces the number of leakage paths between the transistor device and the surrounding supporting silicon substrate and also prevents leakage between adjacent transistors. Conventional planar technology can be utilized in the fabrication of the transistors carried by the suspended beams as well as in the fabrication of transistors in the surrounding substrate.

When a three contact n-channel field effect (or nmos, or nmosfet) transistor device is formed in a p-type substrate, for example, a gate is formed, windows are opened through masks on the surface of the substrate on each side of the gate, and n+ doping of the substrate is carried out. Such a process is well known and is easily done, but the problem is that the next adjacent transistor on the same substrate has to be electrically insulated from the first, particularly where the next adjacent device is to be a p-channel (or pmos, or pmosfet) device instead of another nmos device. The way this is normally done is to make a large window and to implant an n-dopant in the p-type substrate to create an n well, and thereafter to form the opposite transistor in the n well. The difficulty with this procedure is that the boundary between the two adjacent transistors is a pn junction, and to prevent interference with the circuitry by this junction, it becomes necessary to put a reverse voltage across it to create a space charge region in the substrate. The isolating space charge region around each pn junction requires a very large amount of space within the substrate and this severely limits the possible density of the transistors.

An attempt has been made to overcome the foregoing difficulty by eliminating the space charge region and by providing an insulating layer between the adjacent transistors. However, such insulation also requires a great deal of space within the substrate and allows various current leakages to occur, so that this technique also fails to provide the required isolation.

Another limiting factor in the available density of transistor devices within an integrated circuit is the need to provide external connections to the transistor contacts. These connections can cause the size of a transistor to increase by a factor of 10, thereby further limiting the available transistor density. Thus, the challenge in the ultra large scale integration of electronic devices is to provide a structure wherein the transistors can be spaced closely together in as small an area as possible without producing current leakage or parasitic capacitance between adjacent devices.

The present invention provides, in its broadest aspect, a released, isolated microstructure beam which incorporates one or more transistor devices and which is fabricated from a single crystal substrate of a material such as silicon. The released, isolated beam is spaced from adjacent substrate material to eliminate leakage currents, and is surrounded by air, which provides a high dielectric constant to thereby reduce parasitic capacitance. The result is that transistor devices located on such a released, isolated beam can be made extremely small and close together so that not only is the packing density of the devices increased, but their speed of operation is enhanced.

In accordance with the invention, not only single beams but multiple isolated beams may be fabricated and all be released from the surrounding substrate, so that adjacent beams will be isolated both from each other and from the substrate. Each beam may include one or more transistor devices with the air (or vacuum) between such beams reducing the parasitic capacitance and leakage between adjacent devices. The present invention further provides a method by which multiple isolated beams are released from the surrounding structure so as to permit relative movement of the beams with respect to that structure and with respect to each other. The beams may be so fabricated as to be mounted at one end, for example on a substrate side wall as cantilevers, with their opposite ends being free to move. Alternatively, the beams may be mounted on pedestals or on mesas, in stacked or side-by-side arrays. Multiple transistors may be formed on a single beam or on plural beams, and the transistors may be interconnected in a variety of ways to form arrays and circuits. Such interconnected arrays and individual beams may be mounted on springs for motion with respect to the surrounding substrate, or may be mounted on pedestals or substrate sidewalls. These various structures each utilize as a basic structure a released, isolated single crystal silicon beam with metal or polysilicon coated interconnections between adjacent beams and between adjacent transistors within single beams.

The transistor devices fabricated in the isolated beams of the present invention may take a variety of forms. For example, lateral bi-polar transistors may be formed, and transistors utilizing MOSFET or CMOS technologies may be produced and interconnected, utilizing the features of the present invention. Metal and polysilicon conductors provide interconnects between the various beams and transistor devices, and conventional methods of forming such devices are used in conjunction with lateral oxidation and etching steps which release the beams and arrays.

More particularly, and in accordance with one form of the present invention, a cantilever beam is defined in a silicon wafer and is provided with a longitudinal polysilicon gate extending along the top surface thereof. Thereafter, a tip is formed on the bottom surface of the beam adjacent the underlying surface by a lateral oxidation process which also isolates the beam in the manner described, for example, in U.S. application Ser. No. 07/868,138 of Susanne C. Arney et al, filed Apr. 14, 1992, entitled "Methods of Fabricating Integrated, Aligned Tunneling tip Pairs", now U.S. Pat. No. 5,235,187 and assigned to the assignee of the present application. After the oxidation step, the top surface of the beam is ion implanted on opposite sides of the gate to form source and drain electrodes and thereafter the beam is released, as by a wet etch step to remove the oxide. More preferably, a pair of opposed tips are formed in this process, also as described in the aforesaid application Ser. No. 07/868,138. If desired, the top surfaces of the beam on opposite sides of the gate may be metallized to provide contacts to the source and drain. In an alternative form of the invention, the source and drain electrodes are wrapped around the side walls of the beam so that these electrodes are on opposite vertical walls of the beam. The formation of MOSFET devices of the type described above, having source, drain and gate electrodes on a cantilever beam provides a high degree of electrical isolation for the transistor device and, in the case where a single tip or opposed tips are provided, permits amplification of sensed currents to provide a higher degree of sensitivity for measuring instruments and the like. Bipolar junction transistors can similarly be fabricated on cantilevered beams to take even greater advantage of the tip structure.

An improved embodiment of the invention utilizes intersecting contact beams to provide electrical contact with the source and drain portions of the transistor. This structure facilitates the connection and reduces the size thereof to permit a higher density of transistor devices. These intersecting beam contacts are defined in the substrate at the same time the transistor-carrying primary isolating beams are defined, and they are fabricated using the same procedures, thereby simplifying the fabrication of the transistor device and its connections to surrounding electrical circuitry.

The isolated microstructure beam may be formed as a cantilever within a cavity formed in a substrate, as discussed in the aforementioned Ser. No. 07/868,138, with one end of the beam mounted on the cavity wall and electrical connections being made from transistors formed on the cantilever beam to external circuitry on the substrate by way of the fixed end of the beam where it contacts the wall. Alternatively, this primary beam can be fabricated at the surface of the substrate or can be on or mounted to mesas, instead of being in a cavity. Intersecting connector beams contacting the transistor electrodes in the primary cantilever beam may be used to connect the beam transistor to external circuit elements integrated in the substrate surrounding the beam. The transistor electrodes may also be connected to circuit elements separate from the substrate by way of suitable electrical conductors, various connection schemes enabling the source, gate and drain electrodes of the transistors all to be connected to surrounding circuitry in a variety of ways. The intersecting beams may also be LPVD polysilicon or amorphous silicon as in FIGS. 10 and 11, or metal such as CVD W or silicides. The provision of various intersecting connector beams is of particular interest since such intersecting beams are formed of the same material as the microstructure beam and the surrounding substrate, but conductors of polysilicon, amorphous silicon, CVD W or WSi$_2$ may also be used. The use of intersecting connector beams fabricated from the material of the substrate are of primary interest, however, since such intersecting beams can have some resistance, and such a resistance can be a part of the electrical circuit in which the transistor device is connected, as is described more fully in co-pending U.S. application Ser. No 07/906,877 of Susanne C. Arney, Noel C. MacDonald and J. Jason Yao, filed even date herewith, and entitled "Submicron Isolated, Released Resistor Structure" (CRF Docket D-1244), now U.S. Pat. No. 5,287,082 assigned to the assignee of the present application. If desired, the resistance of the intersecting beams can be reduced by providing a metallized, a doped polysilicon, or a silicide coating on the surface thereof for use in connecting the transistor device to surrounding circuitry.

As was described in the aforesaid application Ser. No. 07/868,138, the microstructure beam carrying the transistor device and/or the intersecting connector beams may, if desired, be supported as a cantilever with one end free to move, may be supported on pedestals with one end free for movement, or may be supported immovably by suitably spaced pedestals extending between the respective beams and the substrate on which they are mounted. Such pedestals provide mechanical strength and stability to released, isolated beams where such is required. If desired, the beams may be supported by means of flexible springs and/or transducers to permit controlled movement of the beams with respect to the substrate, for example, in the manner described in co-pending application Ser. No. 07/868,102 of Noel C. MacDonald and J. Jason Yao, filed Apr. 14, 1992 and entitled "Multi-Dimensional Precision Micro-Actuator", now U.S. Pat. No. 5,179,499.

The present invention permits the use of multiple isolated microstructure beams either side by side or in stacks, and further allows multiple transistor devices located along the length of the beams and separated by insulating sections. The multiple beams may be interconnected by suitable conductors, if desired, to form transistor arrays and circuits. Intersecting contact beams provide electrical connections to the isolated microstructure beams and also serve to provide interconnecting supports between adjacent beams, if desired, so as to provide the desired transistor arrays. These arrays may be cantilevered or otherwise suspended for relative motion with respect to each other or to the base, or may be secured so that they do not move, as desired.

Although transistor devices normally will be formed in the isolated beams, whether released or not, in accordance with the present invention, they may also be fabricated in the intersecting beams or in the pedestals which support the beams, such transistor structures being facilitated in accordance with the invention by the fact that the beams are all fabricated from the same material as the substrate; namely, single crystal silicon in the preferred form of the invention. Furthermore, various types of transistors can be fabricated in the beams, utilizing conventional fabrication techniques.

Transistors fabricated in the beams, in the intersecting connectors, or in the pedestals are isolated from each other (by air or vacuum) to prevent parasitic capacitance and leakage currents. Further, the intersecting connector beams provide extremely small contacts for the transistors so that a high density integrated circuit can be formed in a substrate such as single crystal silicon and such integrated circuits can be connected to corresponding circuits formed on the substrate adjacent the location of the beam transistor array.

Although the present invention is described in terms of its fabrication from single crystal silicon, it will be understood that other substrate materials may be used, with suitable modification of the fabrication process steps.

BRIEF DESCRIPTION OF THE DRAWINGS

The foregoing and additional objects, features and advantages of the present invention will become apparent to those of skill in the art from a consideration of the following detailed description of preferred embodiments thereof, taken in conjunction with the accompanying drawings, in which:

FIGS. 4A–4K illustrate typical steps for fabricating the submicron structure of FIG. 2;

FIGS. 6A–6C are diagrammatic illustrations of a microstructure having transistors incorporated in pedestals, or other connections between isolated beams and the underlying substrate;

FIG. 8A is a partial diagrammatic view of a modification of the structure of FIG. 8;

DESCRIPTION OF PREFERRED EMBODIMENTS

Figure 1:
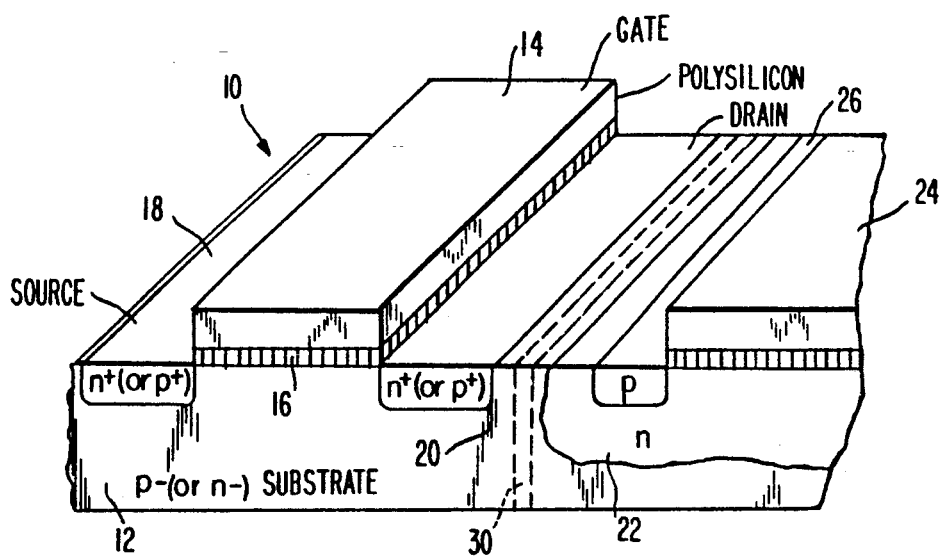
FIG. 1 is a diagrammatic illustration of a conventional planar CMOS transistor device fabricated using conventional VLSI technology.

FIG. 1 is a diagrammatic illustration of a conventional planar NMOS (or PMOS) transistor fabricated with conventional VLSI technology. As illustrated, a NMOS transistor 10 is fabricated in a conventional p− (or n−) type substrate 12 on which is formed a polysilicon gate 14, the gate being separated from the substrate 12 by a thin oxide layer 16. The gate is located between n+ (or p+) implant regions 18 and 20 which, in conventional manner, form the source and drain for the transistor 10. Such devices, and the methods for fabricating them, are well known. In the formation of integrated circuits utilizing this VLSI technology, it is often desirable to provide adjacent transistor devices of opposite type; for example, by placing an NMOS transistor next to a PMOS transistor in the substrate 12. This may be done by implanting an n type dopant in the substrate to form a well 22 on which a gate 24 is formed and a source 26 and drain (not shown) are then formed. Although such techniques are well developed in the art, the difficulty with these devices is that the structure results in a pn junction at the interface 28 between the p type substrate 12 and the n type well 22. This requires a reverse voltage to be placed across the pn junction to create a space charge region which is sufficiently large to prevent current leakage between the two adjacent devices, and this requirement places severe limits on the spacing between the transistors.

An alternative to producing such a space charge region is the provision of an insulating layer, indicated by the dotted lines 30, between the adjacent transistors, but this, too, in addition to being more complex to fabricate, places restrictions on the closeness of spacing of adjacent transistors. Further limits are placed on the size and proximity of the transistors by the need to provide metal contacts on the source, drain and gate regions of the transistor for connection to external circuitry. In addition, the proximity of the various transistor elements and the contacts and metal leads to the transistor elements produces parasitic capacitance between the devices which adversely affects the operation of the circuitry utilizing these transistors.

Figure 2:
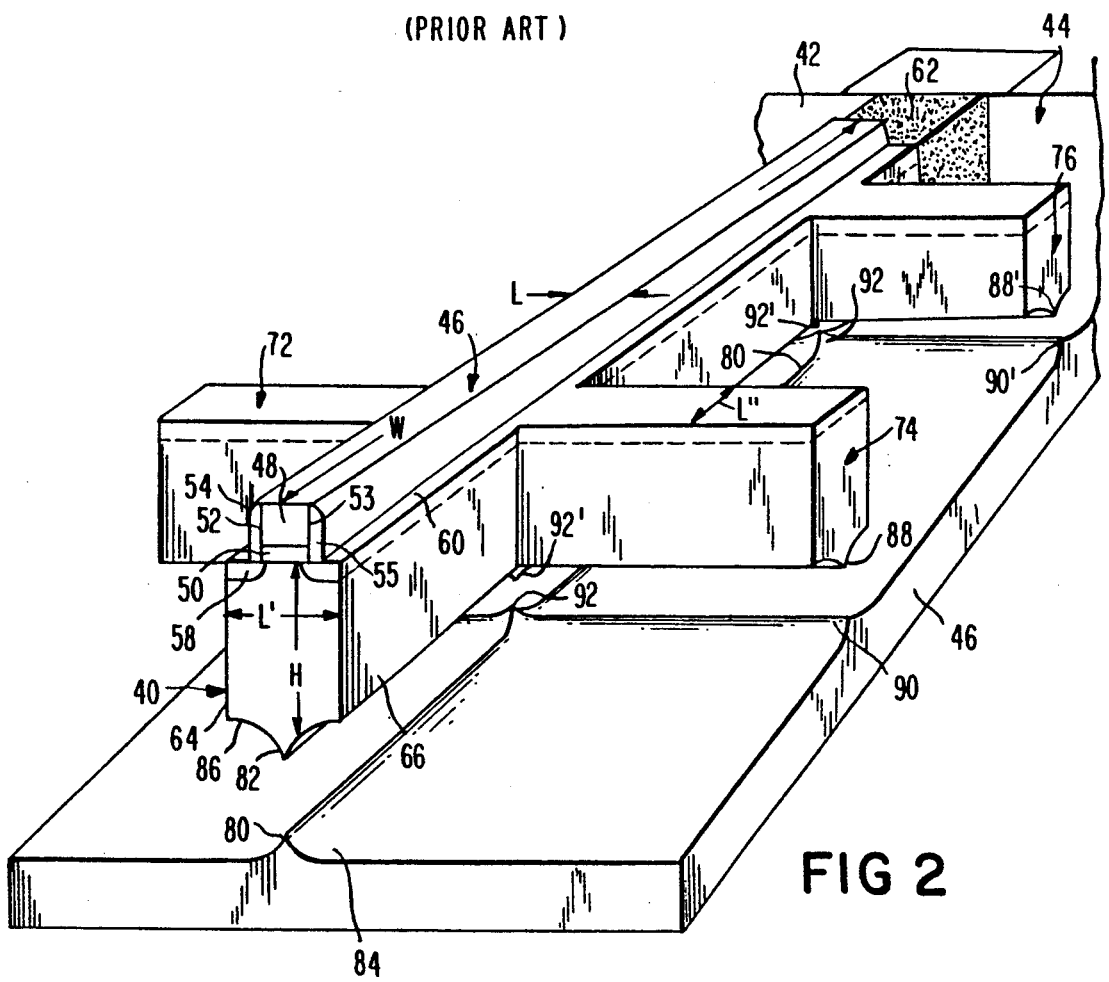
FIG. 2 is a diagrammatic illustration of a first embodiment of the microstructure of the present invention showing a transistor device fabricated on the top surface of a submicron isolated beam.

The present invention overcomes the foregoing difficulties by forming transistor devices on isolated beams. Preferably, these beams are single crystal beams formed from a substrate such as single crystal silicon. Alternatively, substrates incorporating epitaxially deposited or grown silicon, incorporating silicon-germanium epitaxially grown on the surface of a silicon wafer, or like materials may be used. The beams are electrically isolated and then mechanically released from the substrate so that they are surrounded by the ambient atmosphere (for example, air or vacuum). A preferred form of the invention is illustrated in FIG. 2 wherein an isolated released beam 40 is illustrated as being cantilevered from a wall 42 of a cavity 44 formed in a substrate material 46. Such cantilevered, isolated and released beams and the method for forming them is described, for example, in the aforesaid U.S. application Ser. No. 07/699,390, as well as in continuation-in-part application Ser. No. 07/868,138, filed Apr. 14, 1992, the disclosures of which are incorporated herein by reference. As disclosed in these co-pending applications, not only can isolated, released beams be supported in a cantilever fashion in the manner illustrated in FIG. 2, with one end fixed and one end free for relative motion with respect to the substrate, but they can be completely separated from the bottom and side walls of the cavity and supported therein on floor pedestals which may be spaced apart to provide the desired degree of rigidity to the structure. Alternatively, the isolating beams can be supported in part by cantilever connections to the side walls and in part by pedestals, or may be completely separate from the bottom and side walls for three-direction motion but held in position by springs or by transducers such as opposed capacitive plates which, when charged, movably support the beam. Suitable spring supports and transducer supports for relative motion of the beams are disclosed in the aforesaid co-pending application Ser. No. 07/868,102.

In the embodiment of FIG. 2, the beam 40 carries on its upper surface a gate stack 46 which consists of an amorphous or polycrystalline silicon layer 48 supported by a silicon oxide layer 50. The polysilicon and silicon oxide gate stack 46 extends longitudinally along the length of the beam 40 and is centered on its top surface. The gate stack 46 preferably has a dimension L (representing the length of the transistor) approximately one-half the corresponding dimension L' of the beam 40 and is fabricated in accordance with a process to be described. In one form of the invention, the distance L is approximately 0.2 to 0.25 microns and the distance L' is about 0.4 to 0.5 microns. The height H of the beam may be in the range of 0.2 to 2 microns, for example, with the longitudinal length of the beam (corresponding to the dimension W) being, for example, in the range of several millimeters, if desired.

The side walls 52 and 53 of the gate stack preferably are covered by corresponding spacer layers 54 and 55, respectively, these spacer layers being nitride or oxide to insulate and protect the gate stack 46. The top surface of the beam 40 on each side of the gate stack 46 is implanted, as by ion implantation, to form a source 58 and a drain 60. The transistor so formed by the gate, source and drain carried by beam 40 is isolated from adjacent transistors which may be formed on closely adjacent parallel isolated beams which preferably are formed at the same time; i.e., during the fabrication of beam 40. Any number of such isolated, parallel beams can be formed within the cavity 44, and all may be cantilevered from wall 42 or from other side walls of the cavity and released from the surrounding substrate. The beams so fabricated are spaced apart by air (or other ambient gas) or by a vacuum, which have high dielectric constants, and thus have essentially no leakage currents therebetween and essentially no parasitic capacitance between them.

In the illustrated embodiment, the beam 40 is secured to but electrically isolated from the side wall 42 by an insulating segment 62 which is formed in the beam during fabrication thereof, in the manner described in the aforesaid co-pending applications. The insulating segment 62 thus electrically separates the transistor formed on beam 40 from the side wall and the surrounding substrate.

Figure 3:
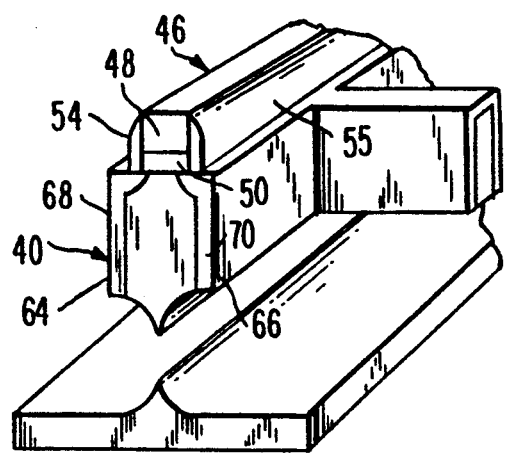
FIG. 3 is a diagrammatic illustration of a modified version of the embodiment of FIG. 2.

Electrical connections to the transistor may be made, for example, by coating the top surfaces of the source and drain segments 58 and 60 and the top surface of the gate stack 46 with a suitable metal to form electrical contacts and thereafter providing metal connectors extending across insulator 62 and leading to the respective contacts from the surrounding substrate. However, because of the small dimensions of the source and drain surfaces, such connections are difficult to fabricate and accordingly, an improved embodiment of the transistor is illustrated in FIG. 3, wherein the source and drain are wrapped around the side walls 64 and 66 of the beam. Thus, as illustrated in this Figure, the ion implantation utilized to fabricate the source and drain electrodes of the transistor is angled (rather than being directed straight down onto the top surface of the beam) so as to strike the two side walls 64 and 66 as well as the top surface. This produces a vertical source region 68 on wall 64 and a vertical drain region 70 on vertical wall 66, thereby providing much larger source and drain regions. These larger regions facilitate electrical connections to the transistor.

The connections to the isolated beam configuration of the present invention are accomplished by means of intersecting connector beams which are fabricated at the same time the isolated beam 40 is fabricated and which intersect beam 40 at spaced locations. Exemplary intersecting beams are illustrated at 72, 74 and 76 in FIG. 2. These intersecting beams are fabricated of the same material as the beam 40 and the substrate 46; thus, they preferably are single crystal silicon. They are integral with the primary beam 40 and extend preferably at right angles to the primary beam, but may extend at any desired angle. These intersecting connector beams preferably have the same cross-sectional area as beam 40; for example, the width L" of the connector beams should be about the same as the width L' of the gate supporting beam.

A single connector beam connected to each of the source and the drain electrodes 58 and 60, respectively, may be sufficient, but if desired plural connector beams spaced along the side walls 64 and 66 of beam 40 may be fabricated to provide electrical contacts at spaced locations along each electrode. The single crystal silicon is resistive, so it may be desired to provide a number of intersecting connector beams in parallel with each other to reduce the resistance to current flow between the transistor carried by beam 40 and other circuit elements such as circuits carried on the substrate 46 or transistors fabricated in nearby isolated beams. The electrical contact with the transistor source and drain may be enhanced, in the embodiment of FIG. 2, by coating the upper and/or side wall surfaces of beam 40 and intersecting beams 72, 74 and 76 with a suitable metal or silicide (which is a film formed by reacting the metal with the silicon), thereby reducing the resistance and facilitating connections to other circuit elements.

It should be understood that the embodiment of FIG. 3 may also incorporate intersecting connector beams of the type illustrated in FIG. 2, as illustrated at 74', for example In the fabrication process for the beams 40, 72, 74 and 76, a release step is employed in which the laterally grown oxidate used to isolate the beams is etched away to separate the beams from the underlying substrate. The lateral oxidation process which forms the beams leaves the facing surfaces of the beams and the underlying substrate shaped to provide opposed tips in the form of ridges such as the upwardly and downwardly extending ridges 80 and 82 in FIG. 2. The upwardly extending ridge 80 formed on the floor 84 of the cavity 44 extends along the length of and is parallel to beam 40 and is vertically self-aligned with the downwardly facing opposed ridge 82 formed on the bottom wall 86 of beam 40. The downwardly facing ridge 82 also is an elongated ridge which extends the length of beam 40. Ridges 80 and 82 may be fabricated to taper to very sharp edges in the nanometer range, and may be spaced apart by a distance determined by the oxidation step used in fabricating the beam.

Each of the intersecting connector beams 72, 74 and 76 similarly has downwardly facing ridges which oppose upwardly facing self-aligned ridges on the floor 84 of the substrate 46. Thus, for example, the bottom wall of intersecting beam 74 incorporates a downwardly facing ridge 88 which is aligned with the upwardly facing ridge 90 on the floor of the substrate. At the intersections of the beams, or at any location where the thickness (or length L) of the substrate material to be oxidized during lateral oxidation is greater, the oxidation step can be controlled to leave upstanding peaks or tips, such as the tips 92 at the intersections of ridges 80 and 90 and 80 and 90'. Similar downwardly facing peaks, or tips, 92' are formed at the intersection of the downwardly facing ridges 82 and 88 at the intersection of beam 40 with beams 72 and 74 and at the intersection of ridges 82 and 88' where beam 40 intersects connector beam 76. It is noted that when the beam 40 is fully intersected, as at connector beams 72, 74, the tips 92, 92' will be symmetrical, whereas a T intersection, as at 40, 76 will produce modified opposed tips. The self-aligned tips 92 and 92' may, in some preferred embodiments of the invention, be sufficiently close together to permit the lower tips 92 to act as benchmarks for motion of the cantilever beam 40. In other embodiments, the opposed tips may carry tunneling currents or other currents indicative of ambient conditions, which currents may be sensed or amplified by the transistors carried on the beam.

In addition to air isolation in all directions to eliminate parasitics, as described above, one of the major advantages of the released structure illustrated in FIG. 2 is that the isolated beam 40 can be made quite long, in the range of centimeters, so that the dimension W becomes relatively large. Since the current I which can be carried by the beam is proportional to the dimensions W/L, and since the dimension L cannot be reduced indefinitely, the ability to make very long beams and to thereby increase the value of W permits the transistor device of the present invention to carry a relatively large current. This relatively large current can be accommodated by the drain electrode 60 (or 70 in the embodiment of FIG. 3) through the use of metallization or silicidation on the surface of the drain or by the use of plural intersecting beams such as beams 74 and 76, or both. The intersecting beams 74 and 76 act as drain bars, and increasing the number of such connectors reduces the effective resistance at the drain. The ability to form the transistor from a material such as single crystal silicon is also a significant advantage because this material has better electronic qualities as well as better mechanical qualities than other substrate materials and further allows the transistor to be made using essentially the same materials as the integrated circuits formed on the surrounding substrate. The quality of the silicon is consistent throughout the entire wafer so that the device produces improved performance.

Although the cantilever beam 40 is illustrated as being fabricated within a cavity formed in a substrate, it will be understood that the beam (or beams) may be formed on a substrate surface, may be formed as, or may be connected to, mesas on a substrate surface, or any combination thereof.

The MOSFET devices of FIGS. 2 and 3 exemplify the variety of transistor devices which can be fabricated in conjunction with isolated submicron beam structures. A typical process for fabricating such a device is illustrated in FIGS. 4A through 4H, to which reference is now made. The starting substrate for making an N-MOSFET device is a boron doped silicon wafer 100, illustrated in FIG. 4A, with a doping density between 1 and $3 \times 10^{17} cm^{-3}$. This high bulk doping density provides released single crystal silicon (SCS) beams that are still suitable for MOSFET fabrication even after high temperature oxidation, for such oxidation introduces a considerable amount of boron dopant segregation out of the SCS beams into the growing oxide. This high dopant concentration is also needed for threshold voltage control in a deep submicron device.

A gate oxide layer 102, which typically is 9 nm thick, is thermally grown in a dry oxygen trichloroethane furnace, followed by a low pressure chemical vapor deposition (LPCVD) of amorphous or polycrystalline silicon forming a gate layer 104. Typically this layer may be 300 nm thick, and may be doped by means of in-situ doping or by ion implantation at a later step. Although polysilicon is preferred for the gate material, a finer gate pattern transfer may be achieved with the use of amorphous silicon. An LPCVD nitride layer 106 having a thickness of about 100 nm is then deposited to serve as the top mask for the subsequent isolation oxidation of the substrate silicon. An oxide layer 108 is deposited to a thickness of about 200 nm, using plasma enhanced chemical vapor deposition (PECVD). This oxide layer serves as the mask to prevent the underlying nitride film from thinning during the subsequent silicon island etch.

Figure 4A:
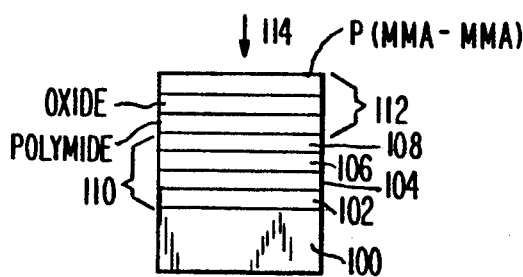
Figure 4F:
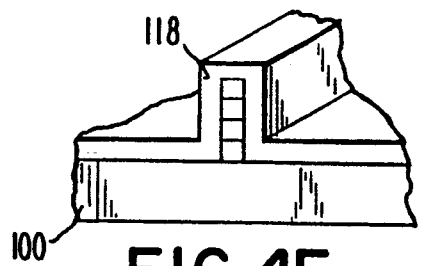
Figure 4B:
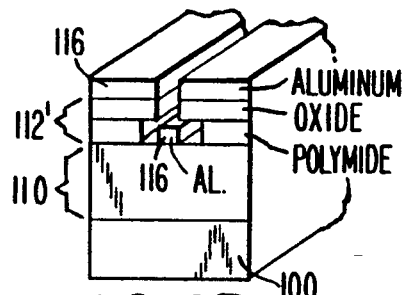

The structural pattern for the gate (such as the gate 46 of FIG. 2) is transferred to the oxide-nitride-polysilicon-gate oxide stack, generally indicated at 110, using a tri-layer resist 112. The tri-layer resist consists of 800 nm polyimide, 80 nm PECVD oxide, and 200 nm P(MMA-MAA) copolymer e-beam resist. Direct-write electron-beam lithography, indicated by arrow 114 in FIG. 4A is carried out by a conventional e-beam lithography machine to define the gate structural pattern. Thereafter, the tri-layer resist 112 is etched, to remove oxide and polyimide in the resist layer pattern to form a mask 112'.

Aluminum is then thermally evaporated perpendicular to the mask 112', resulting in the deposition of a discontinuous aluminum film 116. The aluminum which is deposited on the oxide/polyimide stack 112' is then lifted off by using methylene chloride to dissolve the polyimide material. (FIG. 4C). The remaining aluminum mask 116 on the oxide, nitride, polysilicon layer 108, 106, 104 is used to mask an etch of layers 108, 106 (FIG. 4D). The dielectric layers 106 and 108 are used as a mask for anisotropically etching polysilicon layer 104, during which time the Al layer 116 is removed, and a short RIE is used to remove the gate oxide 102 on opposite sides of the gate region (FIG. 4E). Thereafter, a new nitride/oxide stack 118 is applied to serve as a source/drain masking layer (FIG. 4F) which defines the source/drain areas 120 and 122 shown in FIG. 4G. The source/drain so produced is self-aligned with the gate, i.e., no lithography step is needed to form the support beam which will carry the transistor.

Figure 4G:
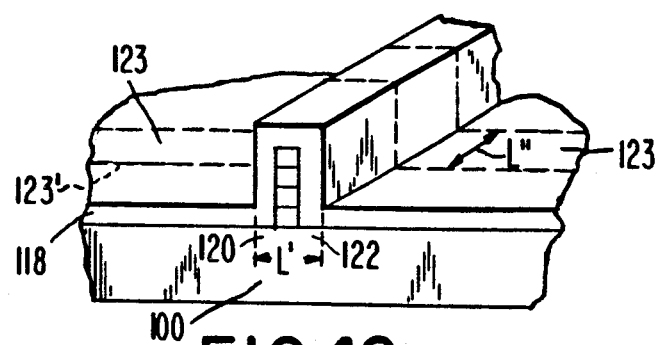
Figure 4C:
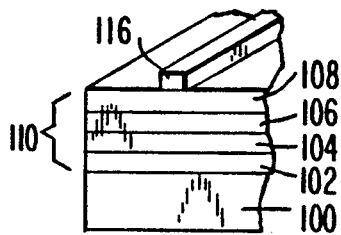
Figure 4H:
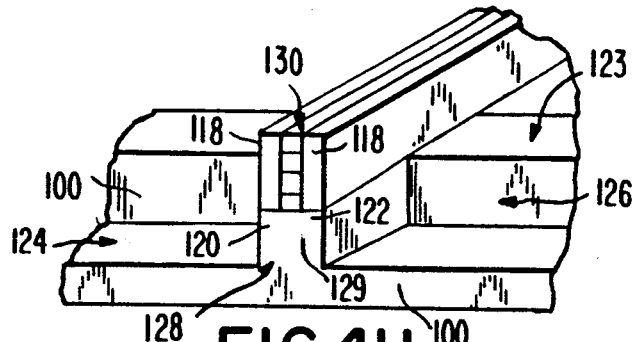
Figure 4D:
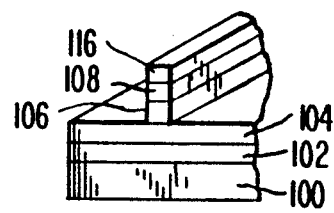
Figure 4E:
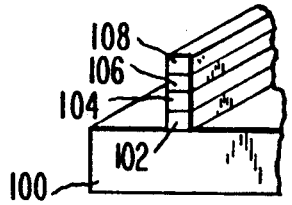

A photolithographic step defines the location of connector beams 123 on top of substrate 100, as illustrated by the dotted line 123' in FIG. 4G. It is preferred that the nominal width L" of the connector beam 123 be about 500 nm, to match the length L' of the beam which supports the gate (FIG. 2). This match between the source/drain connector beams and gate support beam ensures electrical isolation between the device and the substrate after the subsequent steps.

The stack 118 is anisotropically etched back on the surface of the substrate adjacent beams 123 and the gate region, and thereafter the substrate silicon 100 is anisotropically etched by reactive ion etching to create deep trenches 124 and 126 (FIG. 4H) on each side of the gate support beams and the source/drain connector beam regions. The trenching step leaves an upstanding island 128 in the shape of the gate and connector regions, having a gate support beam region 129 carrying a gate generally indicated at 130, source and drain regions 120 and 122 in the support beam region 129 on either side of gate 130, and source/drain connector beams 123.

Figure 4I:
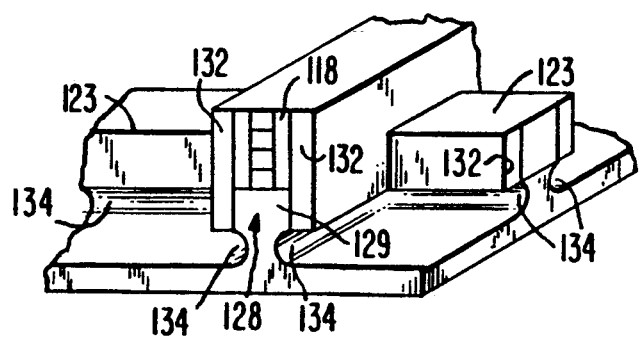

A side wall oxidation mask 132 is formed by depositing an oxide/nitride stack which is etched back on the horizontal surfaces at the top of island 128 in the regions of connector beams 123 and the bottoms of the trenches 124 and 126 to expose the surface of the substrate 100. An isotropic silicon recess etch is then performed on the exposed surfaces of the substrate 100 to produce recesses 134 undercutting the island portion 128 in the gate support and connector beam regions, as illustrated in FIG. 4I. This recess etch enhances the subsequent lateral oxidation at the base of the silicon island 128 by increasing the transport of oxidizing species underneath the island.

An 1100° C. pyrogenic steam oxidation is performed to grow a 600 nm thick field oxide layer 140 which laterally undercuts the silicon island 128 and thus extends under the gate support and connector beam regions, totally isolating the island from the substrate 100, as illustrated in FIG. 4J. As there illustrated, this lateral oxidation shapes the bottom of the island 128 to form a downwardly facing ridge or tip 141 and shapes the upper surface of the substrate 100 to form an upwardly facing ridge or tip 142 which is vertically and axially aligned with the tip 141. Similar tips or ridges are formed beneath the connector beams 123. The oxidation can be controlled to allow the tips to remain connected or to regulate the spacing between them.

Following the oxidation step of FIG. 4J, the nitride masking layers 118 and 132 on the gate and on the island sidewalls are stripped in hot phosphoric acid and an LPCVD nitride film is then deposited and etched back to form ion implantation spacers 144 and 146 on each side of the gate stack and to form island sidewall spacers 144' and 146' illustrated in FIG. 4K. If desired, the connecting beams 123 may be metallized or silicided to increase their conductivity. An n-type dopant 148 such as arsenic is then implanted at 60 keV, $1 \times 10^{16}$cm$^{-2}$ in the now-exposed regions 120 and 122 to form both source and drain areas and to dope the polysilicon gate. The dopant is simultaneously implanted into the source/drain connector beams 123. The dopant may be implanted vertically to form the source and drain electrodes on the top surface of beam 40 resulting in the structure of FIG. 2, or, if the layers 144, 144' and 146, 146' are omitted, i.e., the nitride deposition and etch step is omitted, the dopant can be directed at a slight angle; for example, 3 to 10° from the vertical, to produce the side wall source and drain regions 68 and 70, illustrated in FIG. 3. The thickness of the spacers 144 and 146 helps to control the depth of the implant into the region beneath the gate 130, and thus to control the length L of the transistor channel under the gate.

Thereafter, a thick layer of low temperature oxide is deposited by means of LPCVD. The wafer is subjected to a rapid thermal anneal (RTA) at 950° C. for one minute to activate the implanted dopant, forming a shallow junction. The low temperature oxide is then anisotropically etched back to serve as a spacer layer for electrical contacts to be formed on the gate 130. At this point in the process, selected areas of both the source/drain (and/or the intersecting connector beams 123) and the gate contact areas are exposed for siliciding or metallization. A TiW/Al or Ti/Pt/Al system may be used for the contacts to the MOSFET device, with a lift off scheme using a tri-layer resist process to provide aluminum conductors leading from the contacts to the adjacent structures such as the surrounding substrate, and the conductors are then subjected to a sintering process to obtain ohmic contacts, in conventional manner. The final step in the fabrication sequence is the structural release step, wherein the field oxide 140 is selectively removed, using a buffered hydrofluoric acid solution to leave selected segments of the island 128 isolated from and released from the substrate silicon wafer in the form of suspended beams which may be fixed or if desired, may be free to move with respect to the substrate.

As illustrated in FIG. 4K, the nitride layers 144' and 146' covering the side walls of the gate beam 129 and connector beams 123 extend downwardly below the bottom surface of island 128 and connector beams 123 and are curved at 150 and 152 to form a mechanically very strong structure. This curvature is obtained by the application of the nitride layers 144' and 146' after the isolation oxidation (140) step and subsequent removal of layers 118 and 132. The curvature extends along the length W of the beam 129 and along the length of beams 123 to stiffen them significantly so that they can extend as cantilevers a distance over the substrate 100 without sagging or buckling. This reduces the number of support posts required to support the isolated, released beams to permit fabrication of, for example, a rugged integrated circuit array, as will be described below.

Although the foregoing process is directed to the fabrication of an N-MOSFET, it will be apparent that other transistor devices may similarly be formed on released, isolated microstructure beams. Thus, for example, the fabrication process for a P-MOSFET is very similar to that described above for an N-MOSFET, although the starting substrate material would be an n-type doped silicon wafer. The doping density in the case of a P-MOSFET is not required to be as high as it was in the N-MOSFET case because dopant segregation out of the SCS islands does not occur. Instead, n-type dopants typically are concentrated in the silicon island during the oxidation, so the initial n-type doping concentration can be lower than is required for threshold voltage control of the device. The ion-implantation to form the source/drain areas requires a p-type dopant, such as boron, and the implantation energy and dose are appropriately tailored to provide ohmic p+ contacts to the SCSS islands.

Complementary-MOSFET fabrication may be accomplished through conventional substrate engineering to create wells or tubs for both N and P channel MOSFETs. The conventional methods of substrate engineering include the formation of single n-well and single p-well, and twin wells through ion-implantation or dopant diffusions. As a result, both n− and p− type MOSFETs may be formed on a single SCSS cantilever beam. Furthermore, cantilevered bi-polar junction transistors may also be fabricated using this technology.

Figure 5:
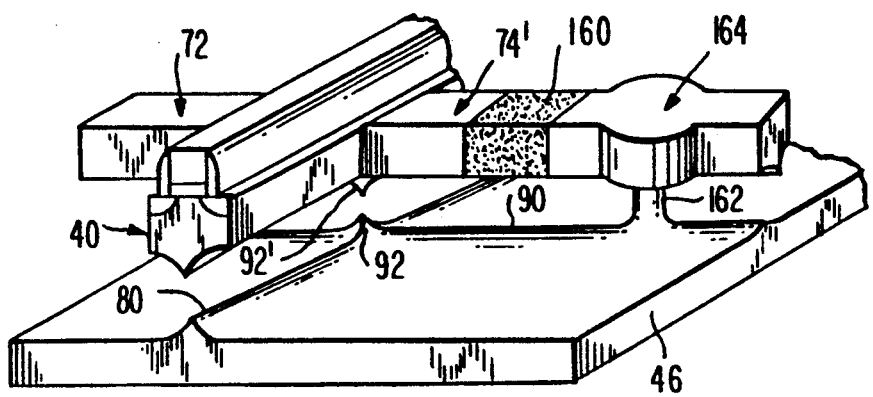
FIG. 5 is a diagrammatic illustration of a modified version of the microstructure of FIG. 2, illustrating the provision of an insulating section and the use of a supporting pedestal.

FIG. 5 illustrates a modified version of the microstructure of FIG. 2, wherein the isolated, released beam 40 fabricated in accordance with an process of FIG. 4, incorporates the transistor structure of FIG. 2 but includes a modified form of the connector beam 74, illustrated at 74'. Beam 74' is fabricated with an insulating segment 160 of nitride or silicon oxide, for example, electrically insulating the portion of the beam 74' adjacent and connected to the beam 40 from the remainder of the connector beam. Segments such as segment 160 may be fabricated in any of the intersecting connector beams as required to electrically insulate the isolated support beam 40 from the surrounding substrate or from an adjacent beam.

An example of a support pedestal for the microstructure of FIG. 5 is illustrated at 162 in FIG. 5. This support pedestal 162 is formed from the material of substrate 100 and is fabricated at the same time the microstructure beams are formed, as by producing an enlarged region 164 in the connector beam 74 (or 74'). Because the oxidation process which produces the field oxide 140 in the fabrication process described in FIG. 4 is relatively constant along the length of beam 74, enlargement of the beam at 164 prevents complete oxidization of the substrate in the region of pedestal 162 during the time required to isolate the remainder of the beam, thereby resulting in a pedestal of unoxidized silicon which will remain to support the structure after the oxide 140 is removed. Such a pedestal is, in effect, a pair of opposed tips which have not been completely separated during the oxidation step. The pedestal 162 provides an electrical connection between the beam segment 164 and the substrate 46 since it is of silicon. If it is desired to provide insulating support pedestals between the beam 74' and the substrate, similar support pedestals of oxide may be provided by selective removal of the field oxide 140, leaving the oxide intact beneath the beams in locations where beam support is desired. Beam 74' is insulated from the substrate by insulator 160, in FIG. 5, but the beam segment including 163 is electrically connected to the substrate.

Pedestals such as that illustrated at 162 may be provided at any desired location on the (released) beam 40 or on any of the connecting beams 72, 74 and 76 to support and stabilize the microstructure within the cavity 44 or on the surface of the substrate. If desired, the cantilever connection to the sidewall of the cavity (or mesa) may be omitted, and the entire structure may be supported by silicon or oxide pedestals. These pedestals may be positioned to prevent motion of the microstructure, or may be selectively positioned so as to permit relative motion of parts of the microstructure having tips such as the opposed tips 92 and 92', which may be fabricated at selected locations. In addition, the isolated beams such as beam 40 may be provided with as many connector beams as are required to provide additional mechanical support as well as electrical contact with the transistors.

Figure 6A:
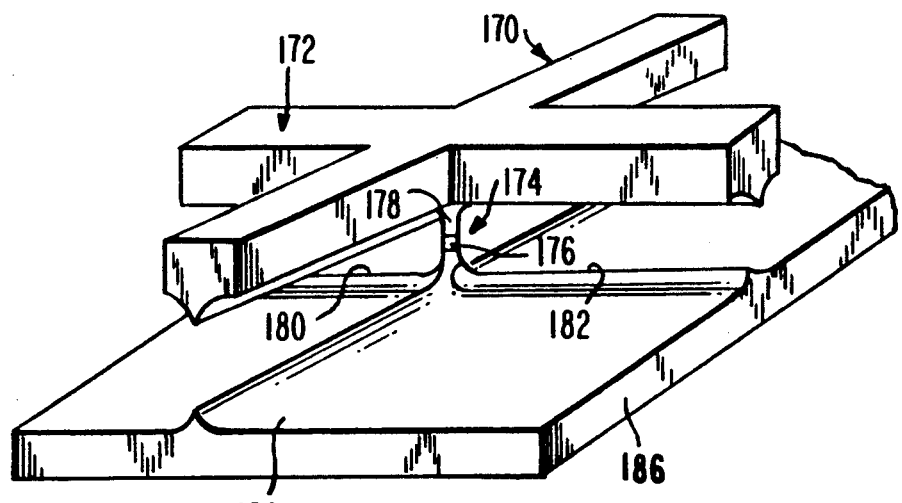

FIG. 6A illustrates another embodiment of the invention wherein the transistor structure is incorporated into a silicon pedestal extending between an isolated beam and the underlying substrate. As there illustrated, a pair of crossed beams 170 and 172 are fabricated in the manner described above. However, in this case the field oxidation step, described with respect to FIG. 4J, is controlled to prevent complete oxidation of the silicon supporting the beams 170 and 172 at their intersection, thereby leaving a pedestal 174 at that intersection. The field oxide 140 is removed by selective etching. A gate oxide segment 176 is then formed in the middle of the pedestal, dividing the upper and lower portions thereof so that the upper end 178 will constitute the gate portion of the transistor. Thereafter, ridge portions 180 and 182, lying beneath the beam 172 in this example and formed during oxidation of the beams, are implanted by a suitable dopant to form source and drain regions, respectively, on the surface 184 of the substrate 186. As before, the substrate and the beams are formed from single crystal silicon in the preferred form of the invention.

An advantage of the structure illustrated in FIG. 6A is that the size of the transistor will be dependent on the diameter of pedestal 174. The lateral field oxidation techniques described above permit the pedestal to be fabricated as a very fine filament in the range of 20 nm in diameter. The gate region of the transistor formed in this pedestal is isolated from nearby structures to reduce leakage and parasitic capacitance, and its very small size permits high speed operation. The source and drain channels may also be isolated from adjacent devices, and from the substrate, as by means of stacked beams, to be described.

As illustrated in FIGS. 6B and 6C, the tip gate contact of FIG. 6A may be made through ridges, as well, thereby providing a longer gate contact. This longer contact permits more current to flow through the channel, since the drain current is proportional to the gate width W, corresponding to the longitudinal dimension of the ridges. Thus, for example, in the fabrication of beam 170, the oxide step is shortened so that the opposed ridges 188 and 190 (FIG. 4J) remain connected along the longitudinal axis of the beam at a central region 192. The central region may then be oxidized to enable the upper ridge portion to operate as a gate, with the substrate 186 being implanted on opposite sides of ridge 190 to form source and drain regions 194 and 196.

FIG. 6C illustrates the transistor of FIG. 6B as being isolated from substrate 186 by means of a second isolating and released beam 198. The second beam includes the source and drain regions 194 and 196 and is released from the substrate 186 in the manner described with respect to the beams 123 and 129 in the description of FIGS. 4A-4K.

The interconnected tips 174 or the ridges 188 and 190 need not be oxidized, as at 176 or 192, to separate the gate beam 170 from the substrate 186 (FIGS. 6A and 6B) or from the lower beam 198 (FIG. 6C), if the connection between the gate and the underlying source/drain region is sufficiently thin. If the connection is drawn down to a filament having a thickness as small as 10-20 nm, the high resistivity of the filament may itself provide the necessary gating action.

As discussed above, a plurality of isolated beams can be fabricated in parallel on a substrate or within a cavity formed in a single crystal silicon substrate. Such an arrangement is diagrammatically illustrated in top plan view in FIG. 7, where a plurality of isolated beams generally indicated at 200, 202 and 204 are fabricated as cantilevers secured to a wall portion 206 which may be the walls of mesas on the surface or may define a cavity 208 in a substrate 210. As before, the substrate 210 may be a single crystal silicon wafer, or the like, with the beams 200, 202 and 204 being microstructures fabricated from the SCSS material in the manner described above. Each of the beams may be similar to the beam 40 illustrated in FIG. 2 and thus may include a central gate portion 212 extending longitudinally along the top surface thereof and flanked on either side by respective source and drain regions 214 and 215.

In the illustrated embodiment, a series of individual transistors 216, 218 and 220 are formed along the length of beam 200 and may be separated by electrically insulating segments 222 and 224. These insulating segments may be oxide or nitride, and segregate the beam into spaced, electrically isolated transistors. If desired, adjacent transistors along the beam can be electrically interconnected by omitting the insulating segments. The beams 200, 202 and 204 are secured to the wall 206 in cantilever fashion by insulating segments 226, 228 and 230, respectively, although it will be evident that these beams may be supported by suitable pedestals in the manner described above. The beams preferably are parallel to each other and are spaced apart so as to provide air isolation between them and are spaced above the floor of the cavity 208, as discussed above.

The beams 200, 202 and 204 are interconnected by a plurality of lateral intersecting connector beams to provide electrical connection points to the transistors and to provide mechanical support of the array. Thus, for example, parallel isolated beams 200 and 202 are joined by intersecting connector beams 230, 232 and 234, each of which has a corresponding insulating segment 236, 238 and 240, respectively, to electrically insulate the adjacent isolated beams from each other while providing mechanical support. As before, these insulating segments may be of nitride or of silicon oxide and are formed during the fabrication of the microstructure.

The isolated primary, or gate support, beams 200, 202 and 204 are shown as being parallel to each other in the preferred form of the array; however, but it will be apparent that they need not be parallel, but can be perpendicular to each other or may be at any other angle, as may be required, for example, by the circuit arrangement in which the transistors are to be connected. Similarly, the connector beams are shown as being perpendicular to the primary beams, but they may be at any angle that will serve their mechanical support and electrical interconnection functions.

The top surfaces of the source and drain regions of each transistor may be silicided or metallized, with the silicide or metallization extending onto the top surfaces of the adjacent connector beams as a local interconnect material. Such a local interconnect may extend laterally across selected insulating regions of the connector beams to selectively join segments of adjacent transistors, and connections to selected transistors in the array may then be made by means of elongated cantilevered connectors such as the interconnect lines 250 through 255. These lines may be fabricated from an electrically conductive material deposited on the array of transistors during the fabrication thereof. Suitable materials for these lines include CVD tungsten; polysilicon, especially doped, silicided or metallized; silicide; selective CVD aluminum; copper, and the like. The interconnect lines 250-255 are connected electrically to selected contact points on the lateral connector beams, for example, to provide the desired connections to the various transistors. Thus, line 250 may be connected to the left-hand beam (as viewed in FIG. 7) of transistor 216, and may be insulated from the corresponding connector beams on transistors 218 and 220. This may be done, for example, by providing insulating oxide layers such as those indicated at 260, on transistors 218 and 220. Alternatively, the top surfaces of the transistors may be covered with an insulating layer of oxide or nitride and the interconnect line deposited thereon, with a via being utilized to connect the line to a selected underlying transistor connector beam. The interconnect lines preferably extend onto the top surface of the adjacent structure, which may be the substrate 210, where they terminate at corresponding electrically conductive contact pads 270 which may be located on insulating sections formed in the substrate. These contact pads permit interconnection of the lines 250 through 255 to selected circuit elements formed on the substrate or externally thereof.

Figure 7:
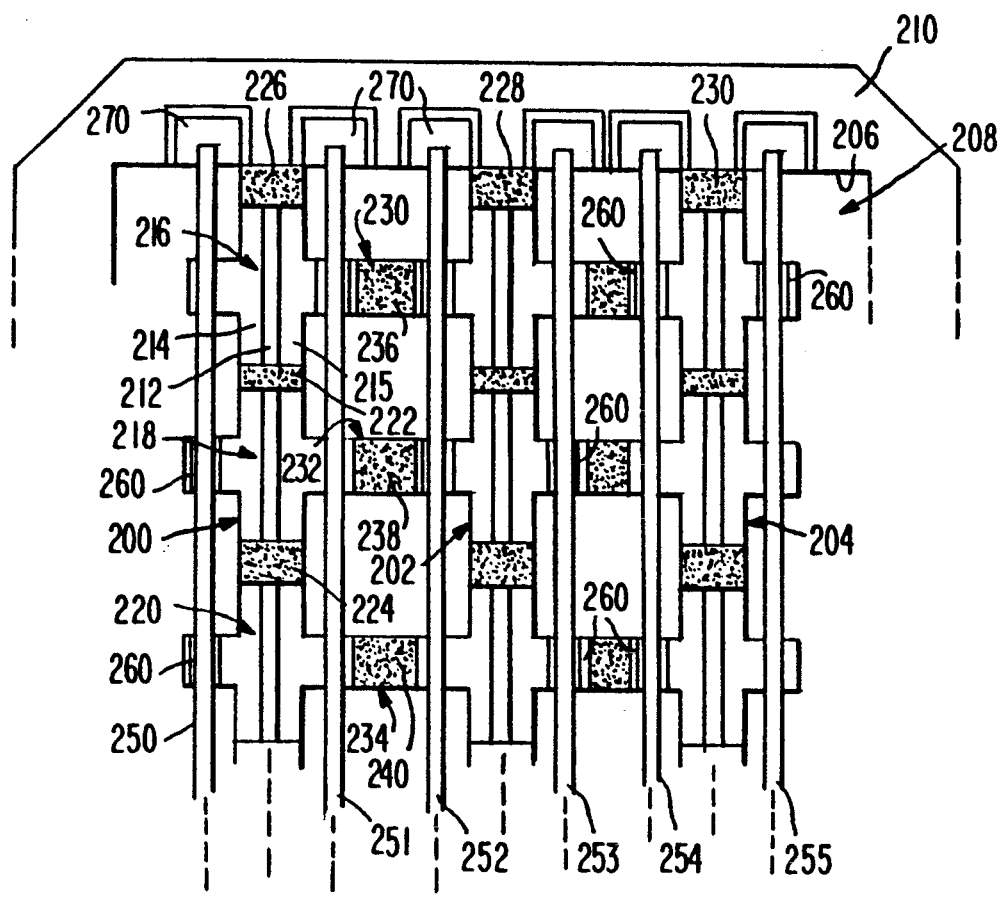
FIG. 7 is a diagrammatic top plan view of an array of submicron isolated, released beams incorporating transistors, and including released, isolated connector beams, and a plurality of interconnect lines.

Although the array of FIG. 7 is shown as having only three transistors in each of three parallel isolated beams, it will be understood that the length of the beams can be extended and additional parallel beams can be added to provide as many transistors as desired in the array. Furthermore, more than a single connector beam can be provided for each transistor in order to provide improved mechanical strength and stability or to provide additional contact points for improved electrical connections.

Figure 8:
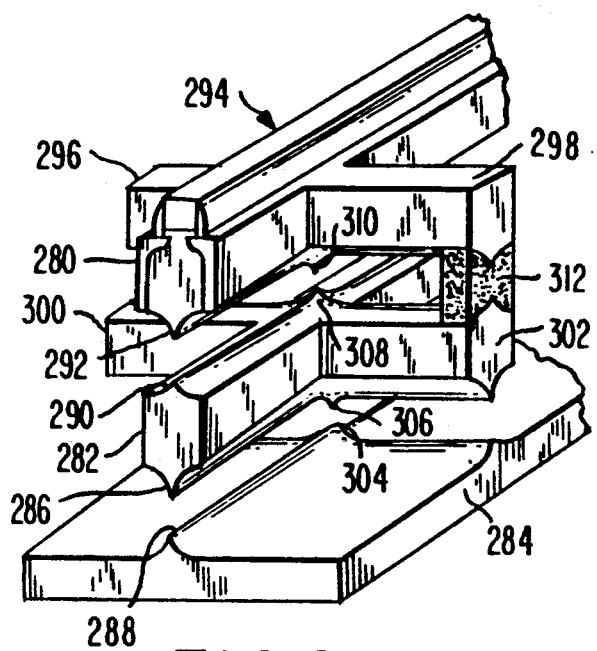
FIG. 8 is a partial diagrammatic view of a stacked array of submicron isolated beams incorporating transistors.

Although the various configurations illustrated hereinabove show the use of multiple transistors and multiple isolated beams in a common plane, it will be apparent that such beams may equally well be stacked in parallel planes, as illustrated in the partial view of FIG. 8. As there illustrated, an isolated beam 280 is fabricated in parallel with and located above a similar beam 282. Both beams may be cantilevered in the manner illustrated in FIG. 2, with the lower beam being spaced above the substrate 284. The lower beam 282 has a downwardly facing ridge 286 on its lower surface which is aligned axially over a corresponding upwardly facing ridge 288 on the substrate 284. Beam 282 also has an upwardly facing ridge 290 on its upper surface which is below and axially aligned with a corresponding downwardly facing ridge 292 on the bottom surface of beam 280. The top of beam 280 carries the gate array 294 fabricated in the manner described with respect to FIG. 2.

Beams 280 and 282 both have intersecting lateral connector beams, beam 280 having oppositely extending lateral beams 296 and 298, and the lower beam 282 having oppositely extending lateral beams 300 and 302. At the intersections of the isolating and connector beams, opposed tip pairs are formed, as previously described. Thus, a pair of vertical, axially aligned, opposed tips 304 and 306 are formed between beam 282 and the substrate 284 and a pair of tips 308 and 310 are formed between the lower beam 282 and the upper beam 280.

The two beams 280 and 282 may be independently cantilevered from a side wall so that they are movable with respect to each other and with respect to the substrate 284 or, if desired, the two beams may be interconnected, as by a pillar 312 extending between lateral contact beams 298 and 302 so that the two connector beams, and thus the primary beams, move together, while the combined stack remains movable with respect to the substrate 284. The pillar 312 can be an insulating material such as oxide 140. Alternatively, it can be conductive; i.e., formed from metal, polysilicon, silicide, or single crystal silicon, so as to provide, in effect, a via which electrically connects the upper connector beam 298 to the lower connector beam 302 and thus to the cantilevered isolated beam 282. In this way, the isolated beam 282 can serve as an interconnect bus line for the transistor or multiple transistors carried by beam 280.

If desired, any of the isolated beams may be fabricated to include an upwardly facing tip, such as the tip 314 in FIG. 8A, for example on the top surface 316 of beam 280. The process for fabricating such a tip is described in the aforesaid co-pending application U.S. Ser. No. 07/868,138, and such a tip can be located, for example, at the intersection of the primary isolated beam 280 and the lateral connector beams 296, 298, replacing the transistor gate structure 294 in that location, as illustrated in the partial view of FIG. 8A.

Figure 9:
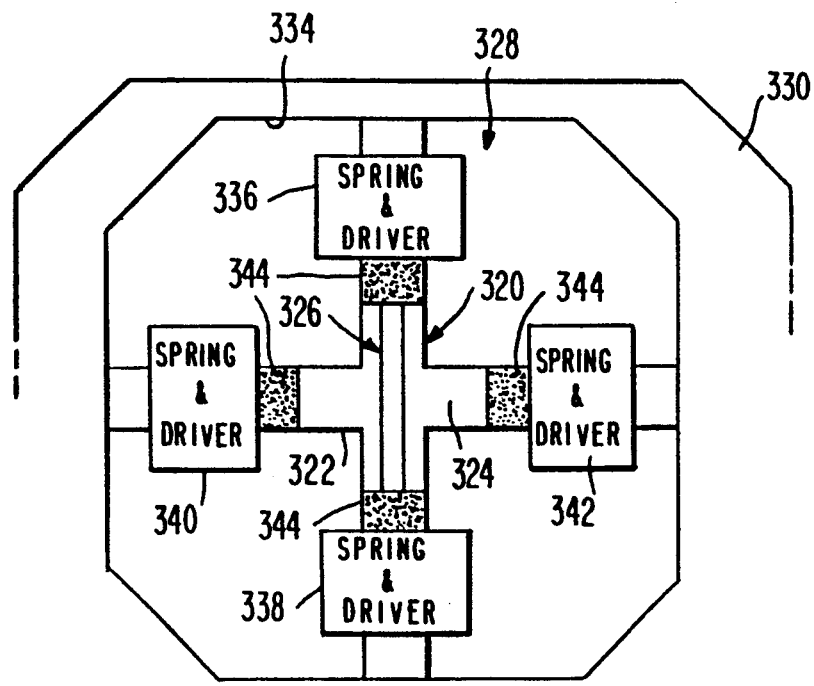
FIG. 9 is a diagrammatic top plan view of an isolated, released beam with drivers and springs.

FIG. 9 is a diagrammatic top plan view of a fully released, isolated beam 320 having intersecting lateral connector beams 322 and 324, the beam 320 incorporating a transistor 326 in the manner previously described. In this case, the isolated beam 320 and its intersecting lateral connector beams are supported for motion within a cavity 328 formed in a substrate 330, as previously described, by means of springs fabricated from the substrate material, in the manner described in co-pending application Ser. No. 07/868,138, or in Ser. No. 07/868,102, (Docket No. CRF D-1151), discussed above. Thus, the upper and lower ends of the beam 320 (as viewed in FIG. 9) are connected to the side wall 334 of cavity 328 through springs 336 and 338, respectively, these springs being shown in block form for simplicity. If desired, the springs 336 and 338 may incorporate transducers such as the capacitive driver described in the aforesaid Ser. No. 07/868,102 so that motion of the released, isolated beam 320 can be controlled by the application of suitable control voltages. In similar manner, the connector beams 322 and 324 are fully released, and are connected to the side wall 334 through corresponding spring and driver assemblies 340 and 342. Insulating segments such as those illustrated at 344 may be provided between the transistor isolated beam 320 and its corresponding springs and drivers and between the connector beams 322, 324 and their corresponding springs and drivers.

The mounting springs 336, 338, 340 and 342 allow the transistor 320 to be moved in a horizontal plane in any direction within the cavity 328 so that the downwardly facing tip (not shown) formed at the intersection of the isolated beam and the connector beams can be moved with respect to its corresponding upwardly facing tip (not shown) on the substrate floor. The relative movability of the tips permits measurement of various parameters, such as acceleration, when one of the tips is moved with respect to the other, with the transistor 326 being located to amplify and measure variations in the tunneling current, for example, between the two tips. It will be understood that a metallized interconnect line, also incorporating a mounting spring if desired, can be provided between the transistor 326 and corresponding circuitry on the substrate 320, if desired. Further, the mounting springs can be secured to pedestals, rather than wall 334, if desired.

Figure 10:
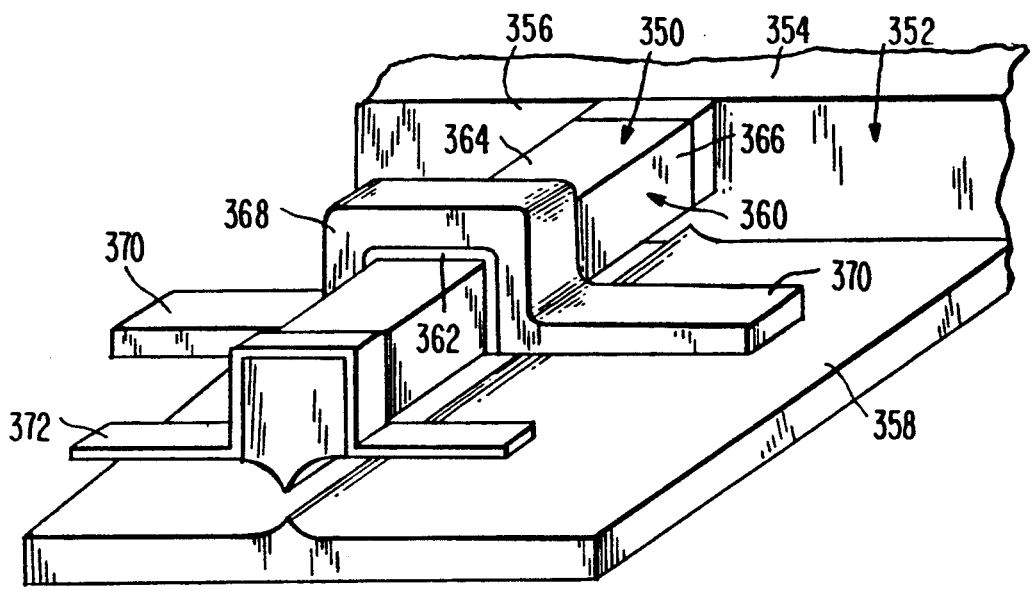
FIG. 10 is a diagrammatic perspective view of another embodiment of the microstructure transistor of the present invention.

FIG. 10 illustrates another embodiment of the present invention wherein the transistor is formed by means of a gate electrode which extends in a direction perpendicular to the longitudinal dimension of a cantilevered isolated beam. As illustrated, a cantilevered beam 350 is formed in a cavity 352 located in a substrate 354, in the manner previously discussed. The cantilever 350 extends from a wall 356 of the cavity (or from a suitable pedestal) in a direction parallel to the floor 358 thereof. In this case, the beam 350 is fabricated as described with respect to FIG. 4, but without the formation of the gate electrode 130. After the field oxide (140 in FIG. 4J) is formed, to isolate the beam, the transistor generally indicated at 360 is formed. First of all, a thin layer of oxide 362 is formed on the top surface 364 and the side wall 366 of beam 350. Thereafter, through a conventional deposition, lithography and etch process, a layer 368 of polysilicon is formed on the oxide layer 362, the polysilicon extending over the top surface 364 and down both side walls 366 of beam 350. The polysilicon layer is extended horizontally outwardly from the beam 350 on the top surface of the field oxide 140 to a distance sufficient to provide a contact surface for an interconnect line, such as a metal or polysilicon strip contacting one or both ends 370 of layer 368 and formed on the surface of oxide 140.

The polysilicon layer 368 and oxide layer 362 forms the gate stack for transistor 360. The source and drain are then implanted on opposite sides of the gate 368 so that the near end (for example) of the beam 350 (as viewed in FIG. 10) becomes the source for the transistor and the far end (as viewed in FIG. 10) becomes the drain. Contact with the source or drain end of the beam 350 may be made by means of a polysilicon or metal interconnect line on the top surface of the beam, such as that illustrated at 372 for the source, which line may extend to the surrounding substrate 354. After the formation of the polysilicon gate 368 and the contact strip 372 (and a similar strip at the drain end of beam 350, if desired), the field oxide is removed in the manner described with respect to FIGS. 4J and 4K, releasing the beam 350 so that it can move with respect to the substrate 358 and so that it is completely isolated from the surrounding substrate to thereby effectively eliminate parasitic capacitance and leakage currents to the substrate.

Figure 11:
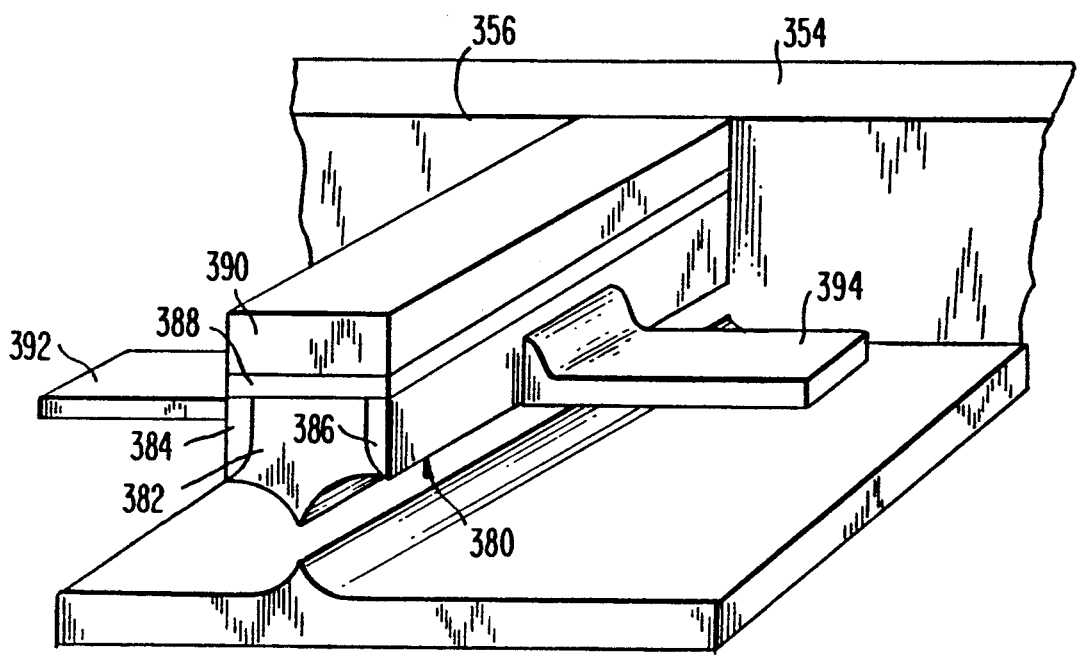
FIG. 11 is a diagrammatic perspective view of a modified form of the microstructure transistor of FIG. 3.

FIG. 11 is a modification of the device of FIG. 3, wherein a cantilevered isolated beam 380 mounted on a wall 356 in the previously described substrate 354 includes a central silicon channel region 382 and corresponding source and drain regions 384 and 386 formed on the side walls thereof. The top surface of the channel region is covered by a thin oxide layer 388 and a gate polysilicon layer 390 is deposited on top of the oxide. In this case, polysilicon is deposited, patterned lithographically, and etched to form strips 392 and 394 on top of the field oxide 140 formed during the lateral oxidation step which separates the beam 380 from its underlying substrate, again as described with respect to FIGS. 4J and 4K. The polysilicon strips 392 and 394 are formed on the top surface of the field oxide 140 and engage the side walls of the beam 380 in the region of the source and drain to form source/drain contacts. Thereafter, the field oxide is removed to release the beam 380, as previously described.

Figure 12:
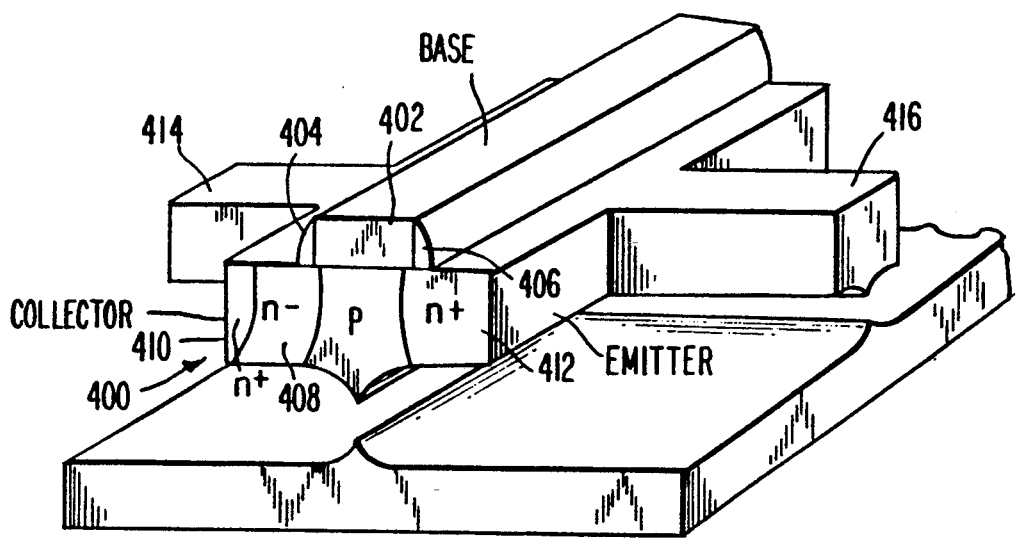
FIG. 12 is a diagrammatic perspective view of a lateral npn bipolar junction transistor fabricated in a microstructure isolated beam.

To illustrate the versatility of the present invention, the provision of a lateral npn bi-polar junction transistor on an isolated beam is illustrated in FIG. 12. In this case, the beam 400 is fabricated as described above, with a polysilicon strip 402 which is deposited and patterned on the top surface of the beam region as in FIGS. 4A, B, C, D. There is no oxide interlayer in this case, so the polysilicon strip 402 is connected to the silicon of the beam 400 to define the base of a bi-polar junction transistor. Nitride or oxide spacers 404 and 406 are formed on each side of the base 402 and thereafter an n− dopant is directed from the left (as viewed in FIG. 12), at an angle onto the top surface of beam 400, adjacent the spacer 404, to thereby implant the n− region 408. An n+ implantation is directed toward the top surface of the beam 400 from the right (as viewed in FIG. 12), to implant n+ material in the collector region 410 and in the emitter region 412, thereby forming an npn junction transistor. It will be apparent that a pnp type transistor can also be formed, by the use of different implant materials. As has been discussed above, this transistor may be connected to exterior circuitry by means of intersecting connector beams 414 and 416.

Figure 13:
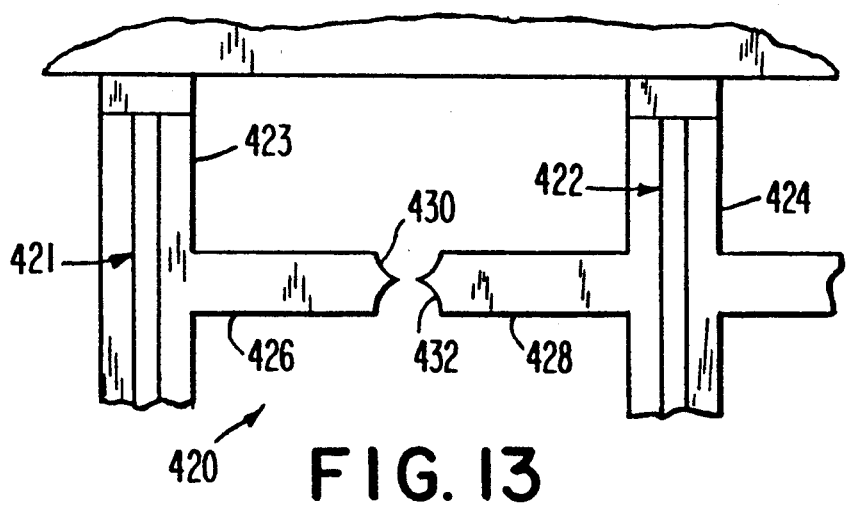
FIG. 13 is a diagrammatic top plan view of an array of transistor devices mounted on isolated beams which incorporate horizontally aligned tips.

Although the invention has been described in terms of submicron structures utilizing vertical, axially aligned tips, it will be apparent that similar structures incorporating horizontal, axially aligned tips may also be fabricated. Thus, for example, as illustrated in top plan view in FIG. 13, an array 420 of transistor devices 421, 422, mounted on isolated beams 423, 424, respectively, may include lateral connector beams 426 and 428 which incorporate a pair of opposed tips 430, 432. The beams 423 and 424 may be cantilevered so that they are relatively movable, with the tips 430, 432 also being relatively movable to vary the current flow therebetween. This current flow is detectable by the transistors 421 and 422 formed in the beams 423 and 424. Alternatively, the beams and connectors may be supported by an oxide layer or by pedestals to prevent relative motion of the beams with respect to each other or the substrates.

Figure 14:
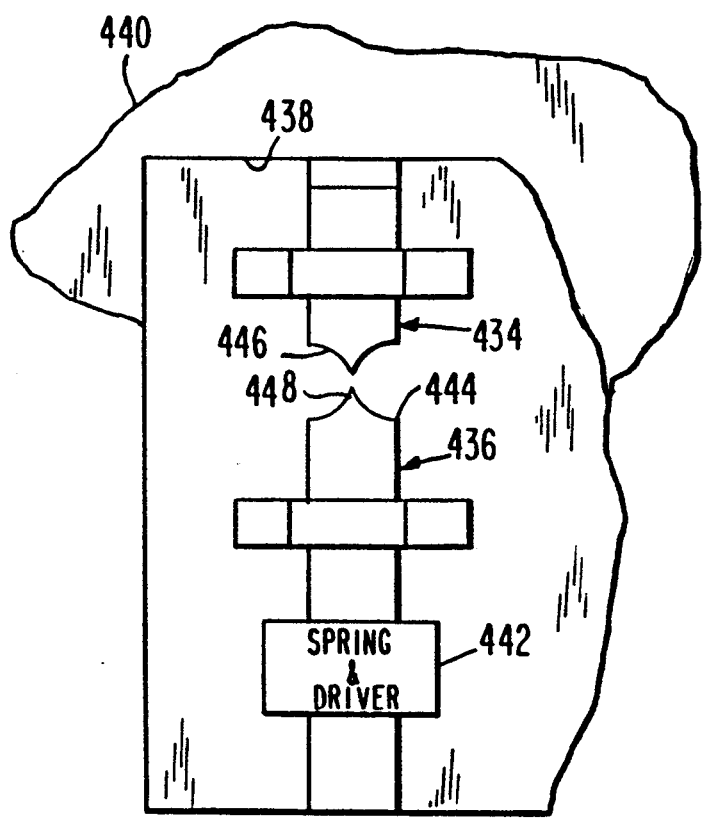
FIG. 14 is a diagrammatic top plan view of transistor devices mounted on isolated cantilever beams having horizontally aligned tips.

As illustrated diagrammatically in FIG. 14, horizontal, axially aligned tips may be formed at the ends of oppositely-extending isolated cantilever beams such as beams 434 and 436, with beam 434 mounted on a side wall 438 of a cavity or a mesa on a substrate 440, or on a pedestal or the like, and beam 436 similarly mounted. The two beams may be supported so that both are stationary, or they be mounted for relative motion. Thus, beam 434 may be securely mounted on wall 438 and supported as required to be stationary, while beam 436 may be mounted on a spring and driver assembly 442 of the type described with respect to FIG. 9, which permits the free end 444 of beam 436 to move with respect to substrate 440 and beam 434. Horizontal, axially aligned tips 446 and 448 are formed on the opposed ends of beams 434 and 436, respectively, to sense relative motion of the beams. Variations and modifications of these tip arrangements will be apparent.

Thus, there has been described a unique microstructure transistor device or array which provides unique advantages in that it provides complete isolation for the transistors while permitting a very dense array of closely spaced transistor devices. By locating the transistors in isolated beams the transistors are protected from current leakage and parasitic capacitive effects. The beams are supported by small contacts with a cavity wall or with a pedestal, and the contacts and the pedestals may be electrically insulating with low capacitance to maintain the beam isolation. Although a variety of preferred forms of the invention have been illustrated, it will be apparent to those of skill in the art that numerous variations and modifications may be made without departing from the true spirit and scope thereof. Accordingly, the scope of the invention is limited only by the following claims.

What is claimed is:

1. A transistor microstructure, comprising:
a substrate;
a beam electrically isolated from said substrate;
means supporting said beam on said substrate; and
a transistor including a gate carried by said beam and a source and a drain in said beam, adjacent said gate.

2. The structure of claim 1, wherein said beam is fabricated from the material of said substrate and is released from said substrate.

3. The structure of claim 2, wherein said means supporting said beam comprises pedestal means.

4. The structure of claim 2, wherein said means supporting said beam comprises at least a first end of said beam being integral with said substrate, whereby the beam forms a cantilever over a portion of said substrate.

5. The structure of claim 2, wherein said beam includes at least one tip.

6. The structure of claim 5, wherein said at least one tip is located on a surface of said beam and extends toward an adjacent surface of said substrate.

7. The structure of claim 5, wherein said at least one tip is located on a surface of said beam, said structure further including a second tip opposed to and aligned with said first tip.

8. The structure of claim 7, wherein said second tip is located on a second beam electrically isolated from said substrate said first and second tips being opposed and aligned.

9. The structure of claim 1, further including electrically insulating means securing said electrically isolated beam on said substrate.

10. The structure of claim 1, further including at least one connector beam intersecting said electrically isolated beam, said electrically isolated beam and said connector beam being fabricated from the material of said substrate and being released from said substrate.

11. The structure of claim 10, wherein said transistor includes an electrode electrically connected to a corresponding connector beam.

12. The structure of claim 10, wherein said transistor includes a first electrode carried on a first region of said electrically isolated beam and second and third electrodes on corresponding second and third regions of said electrically isolated beam, said second and third electrodes each being connected to a corresponding connector beam.

13. The structure of claim 12, further including a cavity formed in said substrate, and wherein said means supporting said electrically isolated beam supports the beam in said cavity.

14. The structure of claim 12, wherein said supporting means includes means integral with one end of said electrically isolated beam to support said isolated beam and said intersecting connector beam as a cantilever.

15. The structure of claim 12, wherein said supporting means includes pedestal means.

16. The structure of claim 12, wherein said substrate and said beams are single crystal silicon.

17. The structure of claim 1, wherein said electrically isolated beam is at least partially released from and is relatively movable with respect to said substrate.

18. A transistor microstructure comprising:
a substrate;
a beam fabricated from the material of said substrate, said beam being released from said substrate to be substantially completely physically and electrically isolated from said substrate;
filament means interconnecting said beam and said substrate, said filament having a in the range dimension of about 20 nm; and
transistor means in said filament.

19. The structure of claim 18, wherein a first portion of said filament forms a gate electrode for said transistor means, and wherein said transistor means includes source and drain means formed on said substrate in contact with a second portion of said filament.

20. A transistor microstructure, comprising
a substrate;
a plurality of isolated beams released from, electrically isolated from, and supported on said substrate;
a transistor on at least a selected isolated beam; and
connector beams intersecting selected isolated beams to form an array of beams.

21. The structure of claim 20, wherein said plurality of isolated beams comprises a plurality of parallel beams supported as cantilevers.

22. The structure of claim 20, wherein each said transistor includes electrodes on said isolated beams in contact with corresponding connector beam means, and further including interconnect lines electrically connected to selected connector beam means.

23. The structure of claim 20, wherein said plurality of beams are coplanar and interconnected to form a transistor array.

24. The structure of claim 23, further including support means supporting said array in spaced relationship with respect to said substrate to electrically and mechanically isolate said beams from the substrate.

25. The structure of claim 24, further including plural transistors on each said isolated beam, each transistor having corresponding connector beam means; and
said structure further including interconnect means electrically coupled to selected connector beams.

26. The structure of claim 20, wherein said plurality of beams comprises at least a pair of isolated beams vertically spaced to form a stack, and further including connector beams for each said isolated beam.

27. The structure of claim 26, wherein each said isolated beam includes tip means.

28. The structure of claim 27, further including means electrically interconnecting at least one corresponding connector beam to each of said isolated beams.

29. The structure of claim 26, wherein said transistor has at least an electrode on one of said isolated beams, one of said connector beams being connected to said electrode, and
means electrically interconnecting said one of said connector beams with a corresponding connector beam on a second of said isolated beams, whereby said second isolated beam forms a bus for said transistor.

30. The structure of claim 29, further including spring means mounting said isolated and connector beams for relative motion with respect to said substrate.

31. The structure of claim 29, further including driver means for controlling the location of said beams.

32. The structure of claim 20, wherein each said transistor includes a gate formed on its corresponding selected isolated beam, said corresponding isolated beam having source and drain regions adjacent to said gate, and further including connector means for providing electrical connections to said source, gate and drain.

33. The structure of claim 32, wherein said connector means comprises at least one connector beam integral with said corresponding selected isolated beam.

34. The structure of claim 32, wherein said connector means comprises at least one connector strip engaging said corresponding selected isolated beam.

35. The structure of claim 32, wherein said corresponding selected isolated beam has a longitudinal axis, and wherein said transistor includes a gate extending longitudinally along said corresponding isolated beam and implanted source and drain regions adjacent said gate.

36. The structure of claim 35, wherein said connector means includes first and second connector beams integral with said corresponding selected isolated beam and extending generally laterally therefrom, said first and second connector beams electrically contacting said source and drain regions, respectively.

37. The structure of claim 32, wherein said corresponding selected isolated beam has a longitudinal axis, and wherein said transistor includes a gate extending laterally across said corresponding beam and source and drain regions adjacent said gate.

38. The structure of claim 32, further including means mounting said plurality of electrically isolated, released beams on said substrate, and further connector means for electrically interconnecting said transistors.

39. The structure of claim 38, wherein said mounting means includes walls formed on said substrate, said beams being secured as cantilevers to said walls.

40. The structure of claim 38, wherein said mounting means includes walls formed on said substrate, said beams being resiliently secured to said walls for relative motion with respect to said substrate.

41. The structure of claim 38, wherein said mounting means comprises pedestal means on said substrate.

42. A transistor microstructure, comprising:
a semiconductive substrate;
an electrically isolated beam fabricated from said semiconductive substrate and located within a cavity in said substrate;
a dielectric support mounting said beam within said cavity; and
a transistor fabricated within and carried by said beam.

43. The microstructure of claim 42, wherein said beam is released from said substrate.

44. The microstructure of claim 43, wherein said dielectric support comprises an electrically insulating segment of said beam.

45. The microstructure of claim 43, wherein said beam includes at least one current-carrying tip aligned with a corresponding tip on said substrate.

46. The microstructure of claim 43, further including at least one released connector beam for connecting said isolated beam to an adjacent beam.

* * * * *